(12) United States Patent
Yeh et al.

(10) Patent No.: US 7,875,478 B2
(45) Date of Patent: Jan. 25, 2011

(54) METHOD FOR CONTROLLING COLOR CONTRAST OF A MULTI-WAVELENGTH LIGHT-EMITTING DIODE

(75) Inventors: Dong-Ming Yeh, Hsinchu (TW); Horng-Shyang Chen, Fongshan (TW); Chih-Feng Lu, Wang-an Township, Penghu County (TW); Chi-Feng Huang, Taoyuan (TW); Tsung-Yi Tang, Taipei (TW); Jian-Jang Huang, Taipei (TW); Yen-Cheng Lu, Banciao (TW); Chih-Chung Yang, Taipei (TW); Jeng-Jie Huang, Yi Chu Shiang (TW); Yung-Sheng Chen, Shengang Township, Taiching County (TW)

(73) Assignee: National Taiwan University, Taipei (TW)

( * ) Notice: Subject to any disclaimer, the term of this patent is extended or adjusted under 35 U.S.C. 154(b) by 713 days.

(21) Appl. No.: 11/819,175

(22) Filed: Jun. 26, 2007

(65) Prior Publication Data

US 2008/0035909 A1 Feb. 14, 2008

(30) Foreign Application Priority Data

Aug. 11, 2006 (TW) .............................. 95141375 A

(51) Int. Cl.
*H01L 21/00* (2006.01)

(52) U.S. Cl. .............................. 438/35; 257/79; 257/89; 257/103; 257/E33.045

(58) Field of Classification Search ................... 438/35; 257/13, 79, 89, 103, E21.086, E33.008, E33.045
See application file for complete search history.

(56) References Cited

U.S. PATENT DOCUMENTS 7,323,721 B2 * 1/2008 Liao et al. ..................... 257/90
2004/0056258 A1 * 3/2004 Tadatomo et al. ............. 257/79

OTHER PUBLICATIONS

Chhajed et al, "Influence of junction temperature on chromaticity and color-rendering properties of trichromatic white-light sources based on light-emitting diodes," Journal of Applied Physics 97, 054506 (2005).*

* cited by examiner

*Primary Examiner*—Matthew C Landau
*Assistant Examiner*—Colleen E Snow
(74) *Attorney, Agent, or Firm*—Rosenberg, Klein & Lee

(57) ABSTRACT

A method for controlling the color contrast of a multi-wavelength light-emitting diode (LED) made according to the present invention is disclosed. The present invention includes at least the step of increasing the junction temperature of a multi-quantum-well LED, such that holes are distributed in a deeper quantum-well layer of the LED to increase luminous intensity of the deeper quantum-well layer, thereby controlling the relative intensity ratios of the multiple wavelengths emitted by the LED. The step of increasing junction temperature of the multi-quantum-well LED is achieved either by controlling resistance through modulating thickness of a p-type electrode layer of the LED or by modifying the mesa area size to control its relative heat radiation surface area.

6 Claims, No Drawings

METHOD FOR CONTROLLING COLOR CONTRAST OF A MULTI-WAVELENGTH LIGHT-EMITTING DIODE

BACKGROUND OF THE INVENTION

1. Field of the Invention

The present invention relates to a light-emitting diode (LED), particularly a method for controlling color contrast of a multi-wavelength LED.

2. Description of the Prior Art

Given the advantages of low power consumption, long service life and diverse features, semiconductor white-light-emitting-diodes (WLEDs) have become a center of attention. Using phosphor, commercialized WLEDs generally convert violet light or blue light photons emitted from indium gallium nitride/gallium nitride (InGaN/GaN)-based multi-quantum-wells (MQWs) into long-wavelength light for white light mixing.

However, the use of phosphor leads to several drawbacks: Stokes-wave energy loss, shorter device lifetime and patent restrictions. By stacking InGaN/GaN-based MQWs of different indium (In) compositions or thicknesses, visible lights of diverse wavelengths are emitted to mix into white light. Based on this rationale, a highly efficient, single-chip, InGaN/GaN MQW WLED can be achieved. Nevertheless, relatively short-range hole migration in InGaN compounds means that the quantum well (QW) nearest to the p-type layer in a light-emitting diode (LED) structure becomes the main source of light emission, thereby making it difficult to control color contrast of multi-color LEDs.

To meet the needs for controlling color contrast of multi-color LEDs, the present invention discloses a method for controlling color contrast of a multi-wavelength LED.

SUMMARY OF THE INVENTION

The primary object of the present invention is to provide a method for controlling color contrast of a multi-wavelength LED in order to modulate intensity ratios of multiple wavelengths emitted by the LED.

Another object of the present invention is to provide a method for controlling color contrast of a multi-wavelength LED, either by modulating thickness of the p-type electrode layer or by modulating the mesa area size of the LED.

To achieve the above objects, the method for controlling color contrast of a multi-wavelength LED made according to the present invention includes at least the step of modulating junction temperature of a (MQW) LED, such that holes can be distributed in a deeper QW layer of the LED to increase luminous intensity of the deeper QW layer, thereby controlling the intensity ratios of the multiple wavelengths emitted by the LED.

According to a preferred embodiment of the present invention, the step of increasing junction temperature of an MQW LED is achieved by increasing resistance of the p-type electrode layer of the LED or increasing the light-emitting surface area of the LED.

According to another embodiment of the present invention, the method for controlling the color contrast of a multi-wavelength LED made according to the present invention reduces the thickness of the p-type electrode layer of the LED to 5 nm~30 nm.

In summary, the method for controlling the color contrast of a multi-wavelength LED made according to the present invention increases junction temperature of the LED either by reducing the thickness of the p-type electrode layer of the LED or by increasing the mesa area size of the LED (in other words, by increasing the light-emitting surface area of the LED to reduce the heat radiation area).

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The method for controlling the color contrast of a multi-wavelength LED made according to the present invention includes at least the step of increasing junction temperature of an MQW LED, such that holes are distributed in a deeper QW layer of the LED to increase luminous intensity of the deeper QW layer, thereby controlling the intensity ratios of multiple wavelengths emitted by the LED.

The MQWs are made of InGaN/GaN.

The method for controlling color contrast of a multi-wavelength LED made according to the present invention reduces the thickness of the p-type electrode layer of the LED to 5 nm~30 nm.

The step of increasing junction temperature of MQW LEDs is achieved by increasing resistance of the p-type electrode layer of the LED or by increasing the light-emitting surface area of the LED.

The method for controlling the color contrast of a multi-wavelength LED made according to the present invention includes a sub-step of increasing resistance of the p-type electrode of the LED either by reducing the thickness of the p-type electrode layer of the LED to 5 nm~30 nm or by increasing junction temperature of the LED through the use or mixing of high-resistance metals to change the metallic composition of the p-type electrode layer of the LED. The sub-step of increasing the junction temperature of the LED through increasing the light-emitting surface area of the LED is achieved by increasing the surface area of the p-type electrode layer or the mesa size of the LED.

According to an embodiment of the present invention, the present invention discloses a process for fabricating flip-chip blue/green dual-wavelength micro-LEDs, wherein the blue/green dual-wavelength LED structure is fabricated by depositing reactants of Metalorganic Chemical Vapor Deposition (MOCVD) thereon. The process for fabricating flip-chip blue/green dual-wavelength micro-LEDs includes the step of: first depositing a 25 nm-nucleation layer at 535° C. before depositing a 2 μm n-GaN layer with a silicon-doping concentration of $5 \times 10^{18}$ cm$^{-3}$ at 1070° C.; and forming QW structures using the following two QW conditions: (1) growth conditions for green-light QWs: temperature at 690° C.; wafer carrier rotation speed at 750 rpm; nitrogen ($N_2$) flow rate at 3,000 sccm; ammonia ($NH_3$) flow rate at 3,000 sccm; and (2) growth conditions for blue-light QWs: temperature at 710° C.; wafer carrier rotation speed at 1,500 rpm; nitrogen ($N_2$) flow rate at 1,000 sccm; ammonia ($NH_3$) flow rate at 1,500 sccm. Using the two different growth conditions for green-light and blue-light QWs mentioned above, QWs comprising diverse indium (In) compositions are deposited to create emissions of diverse colors. Following the same growth conditions, QWs are deposited to create a pure blue-light or a pure green-light LED. In this two-color QW structure, the present invention arranges the four QW structure in the order of green light/blue light/blue light/green light, wherein all the QWs are 3 nm thick, with a 16 nm-thick GaN barrier layer forming from a silicon-doping concentration of $7 \times 10^{17}$ cm$^{-3}$ at 800° C. below the deepest QW. Among the other four barrier layers, the first two barrier layers (counting from the top) are 6 nm thick, whereas the next two barrier layers are 16 nm thick. During the deposition process of the 6 nm-thick barrier layers, deposition stops after forming an approximately 2 nm-thick GaN cap layer at the same temperature as that of the QW layer. When deposition stops, wafer temperature is increased to 800° C. and 500 sccm nitrogen is added to the deposition chamber. The barrier layer nearest to the p-type electrode layer is constituted into a thinner layer, which facilitates hole capture from a deeper QW. The growth of the four QWs is followed by the deposition of a 20 nm-thick p-$Al_{0.2}Ga_{0.8}N$ layer and a 120 nm-thick p-GaN layer at 930° C. Based on this QW structure, LEDs can be fabricated using general standard procedures, wherein the p-type electrode layer is made of Ni (15 nm)/Au (150 nm), whereas the n-type electrode layer is made of Ti (15 nm)/Al (75 nm)/Ti (15 nm)/Au (150 nm).

According to the embodiment of the flip-chip blue/green dual-wavelength micro-LEDs according to the present invention, the p-type electrode layer covers the entire mesa area. With the use of different mesa areas or p-type electrode layers, different thermal effects lead to different junction temperatures. In a device having a higher junction temperature, hole migration is enhanced when thermally excited holes escaping from the QW nearest to the p-type GaN layer are captured by the neighboring QWs, such that the likelihood of emitting another color light becomes higher. On the other hand, in an LED having a larger mesa area, the smaller ratio of the sidewall mesa surface area to its active volume leads to less effective sidewall heat radiation effects and thus a higher junction temperature.

In summary, when applying the method for controlling color contrast of a multi-wavelength LED of the present invention to flip-chip blue/green dual-wavelength micro-LEDs, the relatively stronger blue intensity over the green intensity increases with an increase in mesa areas (that is, an increase in the surface area of the p-type electrode layer of the LED), due to enhanced hole capture from the deeper QW layers at a higher junction temperature. Consequently, the present invention can modulate intensity ratios of multiple wavelengths emitted by an LED, which has an extremely high potential for color micro-display.

According to another embodiment of flip-chip blue/green dual-wavelength micro-LEDs made according to the present invention, the p-type electrode layer of the LED is 5 nm~30 nm thick and has a relatively higher resistance compared with that of a conventional LED, thereby increasing junction temperature of the LED. This higher junction temperature enhances hole capture from a deeper QW layer in order to modulate the intensity ratios of multiple wavelengths emitted by the LED.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for controlling the color contrast of a multi-wavelength light-emitting diode (LED), comprising the step of:
   providing an light-emitting diode (LED), said LED comprising a multi-quantum-well structure, a mesa area and a p-type electrode layer; and
   increasing junction temperature of said LED, such that holes are distributed in a deeper quantum-well layer of said LED to increase luminous intensity of said deeper quantum-well layer;
   wherein the junction temperature is increased by reducing thickness of said p-type electrode layer to a range between 5 nm and 30 nm, in which resistance of the p-type electrode layer is increased;
   wherein when said LED generates more than two different colors of light by said multi-quantum-well structure, an intensity ratio of corresponding multiple wavelengths of the light emitted by said LED corresponds to the increased junction temperature.

2. The method for controlling the color contrast of a multi-wavelength light-emitting diode (LED) as claimed in claim 1, wherein while said LED is a flip-chip micro-LED, further comprising a sub-step of increasing light-emitting surface area of said LED by covering the entire mesa area by said p-type electrode layer.

3. The method for controlling the color contrast of a multi-wavelength light-emitting diode (LED) as claimed in claim 1, wherein said multi-quantum-well structure is an indium gallium nitride/gallium nitride (InGaN/GaN)-based multi-quantum-well structure.

4. A multi-wavelength light-emitting diode (LED) applying the method for controlling the color contrast of a multi-wavelength LED as claimed in claim 1, wherein said p-type electrode layer of said multi-wavelength LED is 5 nm.about.30 nm thick.

5. The multi-wavelength light-emitting diode (LED) as claimed in claim 4, wherein said multi-wavelength LED is a flip-chip micro-LED.

6. The multi-wavelength light-emitting diode (LED) as claimed in claim 5, wherein a p-type electrode layer of said flip-chip micro-LED covers a mesa area entirely.

* * * * *

UNITED STATES PATENT AND TRADEMARK OFFICE
CERTIFICATE OF CORRECTION

| | | |
|---|---|---|
| PATENT NO. | : 7,875,478 B2 | Page 1 of 1 |
| APPLICATION NO. | : 11/819175 | |
| DATED | : January 25, 2011 | |
| INVENTOR(S) | : Yeh et al. | |

It is certified that error appears in the above-identified patent and that said Letters Patent is hereby corrected as shown below:

On the title page, the Foreign Application Priority Data should read:

Item (30) Nov. 8, 2006 (TW) ...........................95141375 A

Signed and Sealed this
Twenty-eighth Day of May, 2013

Teresa Stanek Rea
*Acting Director of the United States Patent and Trademark Office*